United States Patent
Yeh

(10) Patent No.: US 10,565,052 B2
(45) Date of Patent: Feb. 18, 2020

(54) DATA PROTECTING METHOD, MEMORY CONTROL CIRCUIT UNIT AND MEMORY STORAGE APPARATUS

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 100 days.

(21) Appl. No.: 15/908,831

(22) Filed: Mar. 1, 2018

(65) Prior Publication Data
US 2019/0196903 A1 Jun. 27, 2019

(30) Foreign Application Priority Data
Dec. 27, 2017 (TW) .............................. 106146006 A

(51) Int. Cl.
| G06F 11/10 | (2006.01) |
| G11C 29/52 | (2006.01) |
| G06F 3/06 | (2006.01) |
| G11C 29/04 | (2006.01) |

(52) U.S. Cl.
CPC .......... *G06F 11/1068* (2013.01); *G06F 3/064* (2013.01); *G06F 3/0614* (2013.01); *G06F 3/0619* (2013.01); *G06F 3/0659* (2013.01); *G06F 3/0679* (2013.01); *G06F 3/0688* (2013.01); *G11C 29/52* (2013.01); *G11C 2029/0411* (2013.01)

(58) Field of Classification Search
CPC .. G06F 11/1068; G06F 3/0614; G06F 3/0659; G06F 3/0679; G11C 29/52
See application file for complete search history.

(56) References Cited

U.S. PATENT DOCUMENTS

| 2014/0337681 A1* | 11/2014 | Liang .................. G06F 11/1044 714/755 |
| 2015/0339187 A1* | 11/2015 | Sharon .................. G11C 29/52 714/766 |

* cited by examiner

Primary Examiner — Guy J Lamarre
(74) Attorney, Agent, or Firm — JCIPRNET

(57) ABSTRACT

A data protecting method, a memory control circuit unit and a memory storage apparatus are provided. The method includes generating a first temporary parity code group based on first data written into a first super physical unit; generating a second temporary parity code group by performing a logic operation on second data written into a second super physical unit and the first temporary parity code group; and generating an updated parity code group by performing the logic operation on the second temporary parity code group and the first data when data of the first super physical unit all become invalid data.

20 Claims, 17 Drawing Sheets

DATA PROTECTING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 106146006, filed on Dec. 27, 2017. The entirety of the above-mentioned patent application is hereby incorporated by reference herein and made a part of this specification.

BACKGROUND

Technology Field

The invention relates to a data protecting method for a rewritable non-volatile memory and a memory control circuit unit and a memory storage apparatus using the method.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

In general, the rewritable non-volatile memory module includes a plurality of super physical units. Each of physical erasing units of each super physical unit includes a plurality of physical programming units, and each super physical unit may include a plurality of super physical programming units. In other words, one of the super physical programming units in each super physical unit is composed of one of the physical programming units from each physical erasing unit of each super physical unit. In particular, all or a part of the different physical programming units in one super physical programming unit of the super physical unit may be programmed synchronously.

The following description is provided with an example in which the physical erasing units included by one super physical unit belong to eight different memory planes, respectively. In the conventional technology, when protection is to be made on data stored in the rewritable non-volatile memory module, a group of parity codes are used to protect each of the physical erasing units belonging to the different memory lanes in the rewritable non-volatile memory module. For example, when a write command for wiring data into one super physical unit is received, while the data is being written into that super physical unit, the parity code for protecting data is generated based on the data in each of the physical erasing units. Since one physical erasing unit is taken as a protection unit, it is required to store the generated parity code into one physical erasing unit. In other words, when the parity codes are assigned with eight physical erasing units belonging to the different memory planes as one group, since one physical erasing unit is required to store the parity code, a storage space available is reduced by ⅛ overall.

Based on the above, the conventional technology requires a lot of the storage space if the physical erasing unit is taken as the protection unit for data. However, given that the storage space of the rewritable non-volatile memory module is limited, how to reduce data quantity of the stored parity codes while maintaining a reliability of the stored data is one of issues to be addressed by persons skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a data protecting method, a memory control circuit unit and a memory storage apparatus. Based on the present invention, not only can the data stored in the rewritable non-volatile memory module be effectively protected, a certain number of super physical units may also be protected while saving the storage space for storing the parity codes.

A data protecting method for a rewritable non-volatile memory module is provided according to an exemplary embodiment. The rewritable non-volatile memory module includes a plurality of super physical units. The data protecting method includes: writing first data into a first super physical unit; generating a first temporary parity code group based on the first data; writing second data into a second super physical unit; and generating a second temporary parity code group by performing a logic operation on the second data and the first temporary parity code group. In addition, the data protecting method further includes generating an updated parity code group by performing the logic operation on the second temporary parity code group and the first data stored in the first super physical unit when data in the first super physical unit all become invalid data.

A memory control circuit unit controlling a rewritable non-volatile memory module is provided according to an exemplary embodiment. The memory control circuit unit includes a host interface, a memory interface and a memory management circuit. The host interface is configured to electrically connect to a host system. The memory interface is configured to electrically connect to the rewritable non-volatile memory module. The rewritable non-volatile memory module includes a plurality of super physical units. The memory management circuit is electrically connected to the host interface and the memory interface. Here, the memory management circuit is configured to write first data into a first super physical unit. Further, the memory management circuit is further configured to generate a first temporary parity code group based on the first data, write second data into a second super physical unit, and generate a second temporary parity code group by performing a logic operation on the second data and the first temporary parity code group. Moreover, the memory management circuit is further configured to generate an updated parity code group by performing the logic operation on the second temporary parity code group and the first data stored in the first super physical unit when data in the first super physical unit all become invalid data.

A memory storage apparatus, which includes a connector, a rewritable non-volatile memory module and a memory control circuit unit, is provided according to an exemplary embodiment. The connector is configured to electrically connect to a host system. The rewritable non-volatile memory module includes a plurality of super physical units. The memory control circuit unit is electrically connected to the connector and the rewritable non-volatile memory module. Here, the memory control circuit unit is configured to write first data into a first super physical unit, generate a first temporary parity code group based on the first data, write second data into a second super physical unit, and generate a second temporary parity code group by performing a logic operation on the second data and the first temporary parity code group. Moreover, the memory control circuit unit is further configured to generate an updated parity code group by performing the logic operation on the second temporary parity code group and the first data stored in the first super physical unit when data in the first super physical unit all become invalid data.

Based on the above, when there are errors in any one physical erasing unit, the data protecting method, the memory control circuit unit and the memory storage apparatus according to the exemplary embodiments of the invention are capable of recovering the data stored in the physical erasing unit having the errors by utilizing the data and the generated parity codes from the other physical erasing units. As a result, not only can the data stored in the rewritable non-volatile memory module be effectively protected, a certain number of super physical units may also be protected by using the parity code groups while saving the storage space for storing the parity codes.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
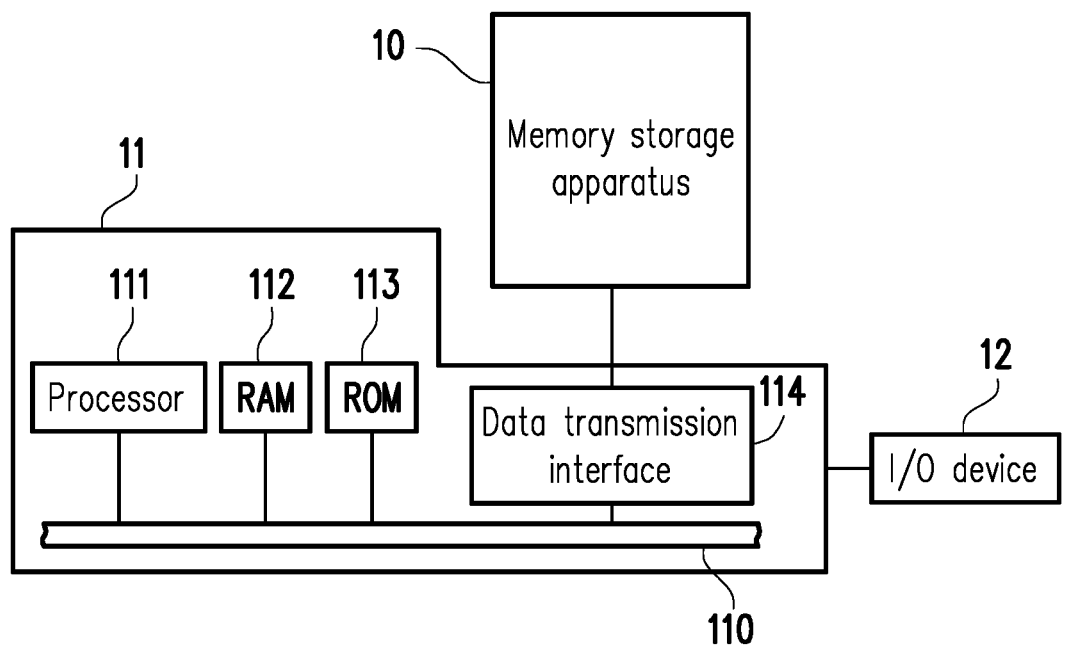
FIG. 1 is a schematic diagram illustrating a host system, a memory storage apparatus and an input/output (I/O) device according to an exemplary embodiment.

Reference will now be made in detail to the present preferred embodiments of the present disclosure, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage apparatus (a.k.a. a memory storage system) includes a rewritable non-volatile memory module and a controller (a.k.a. a control circuit unit). The memory storage apparatus is usually configured together with a host system so the host system can write data into the memory storage apparatus or read data from the memory storage apparatus.

Figure 2:
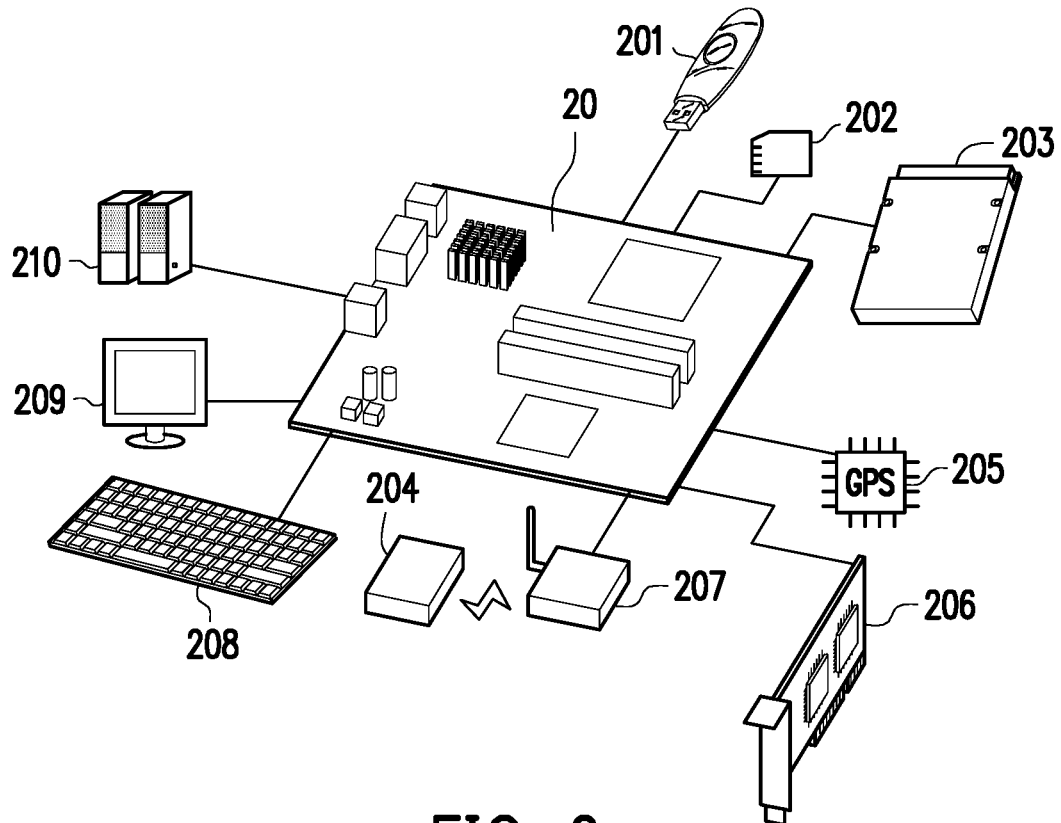
FIG. 2 is a schematic diagram illustrating a host system, a memory storage apparatus and an input/output (I/O) device according to another exemplary embodiment.

FIG. 1 is a schematic diagram illustrating a host system, a memory storage apparatus and an input/output (I/O) device according to an exemplary embodiment, and FIG. 2 is a schematic diagram illustrating a host system, a memory storage apparatus and an input/output (110) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage apparatus 10 through the data transmission interface 114. For example, the host system 11 can write data into the memory storage apparatus 10 or read data from the memory storage apparatus 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interfaces 114 may be one or more. Through the data transmission interface 114, the main board 20 may be coupled to the memory storage apparatus 10 in a wired manner or a wireless manner. The memory storage apparatus 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as a NFC (Near Field Communication Storage) memory storage apparatus, a WiFi (Wireless Fidelity) memory storage apparatus, a Bluetooth memory storage apparatus, a BLE (Bluetooth low energy) memory storage apparatus (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage apparatus 204 through the wireless transmission device 207.

Figure 3:
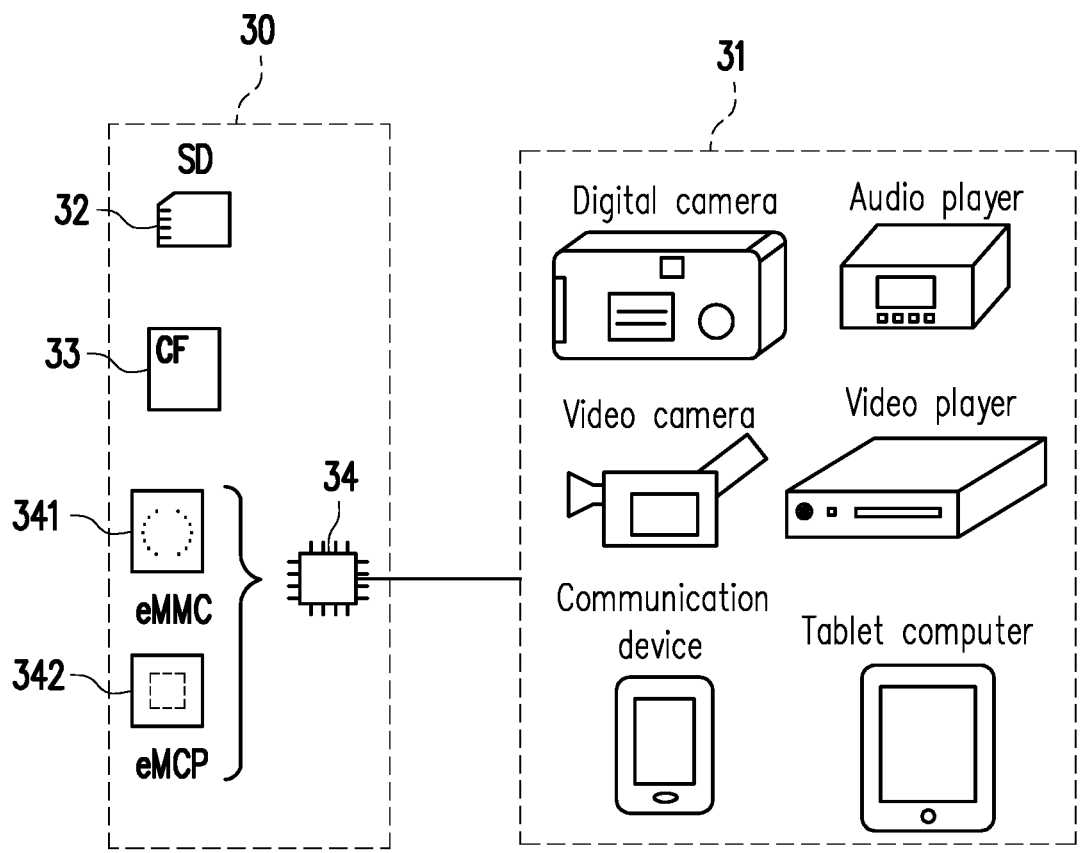
FIG. 3 is a schematic diagram illustrating a host system and a memory storage apparatus according to another exemplary embodiment.

In an exemplary embodiment, aforementioned host system may be any system capable of substantially cooperating with the memory storage apparatus for storing data. Although the host system is illustrated as a computer system in the foregoing exemplary embodiment, nonetheless, FIG. 3 is a schematic diagram illustrating a host system and a memory storage apparatus according to another exemplary embodiment. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory storage apparatuses used by the host system, such as a SD card 32, a CF card 33 or an embedded storage apparatus 34. The embedded storage apparatus 34 includes various embedded storage apparatuses capable of directly coupling a memory module onto a substrate of the host system, such as an eMMC (embedded MMC) 341 and/or an eMCP (embedded Multi Chip Package) 342.

Figure 4:
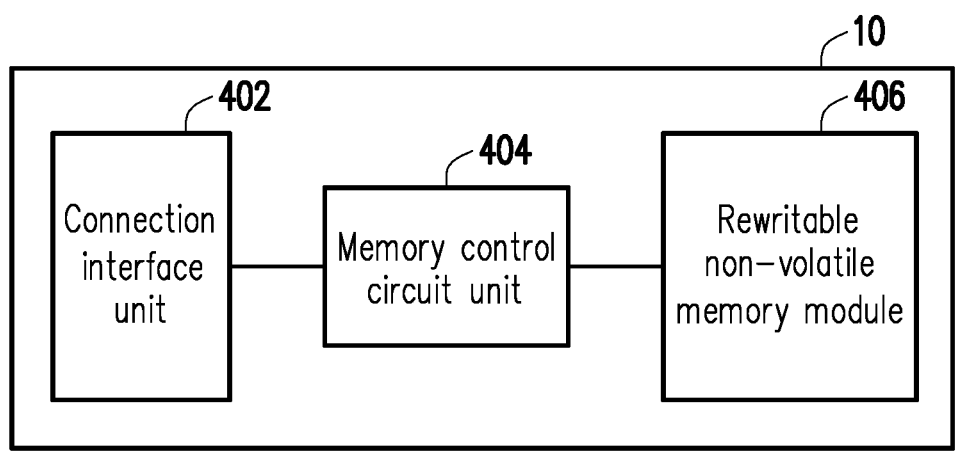
FIG. 4 is a schematic block diagram illustrating a host system and a memory storage apparatus according to an exemplary embodiment.

FIG. 4 is a schematic block diagram illustrating a host system and a memory storage apparatus according to an exemplary embodiment.

Referring to FIG. 4, the memory storage apparatus 10 includes a connection interface unit 402, a memory control circuit unit 404 and a rewritable non-volatile memory module 406.

In the present exemplary embodiment, the connection interface unit 402 is compatible with a Secure Digital (SD) interface standard. Nevertheless, it should be understood that the invention is not limited to the above. The connection interface unit 402 may also be compatible to a SATA (Serial Advanced Technology Attachment) standard, a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

Figure 5:
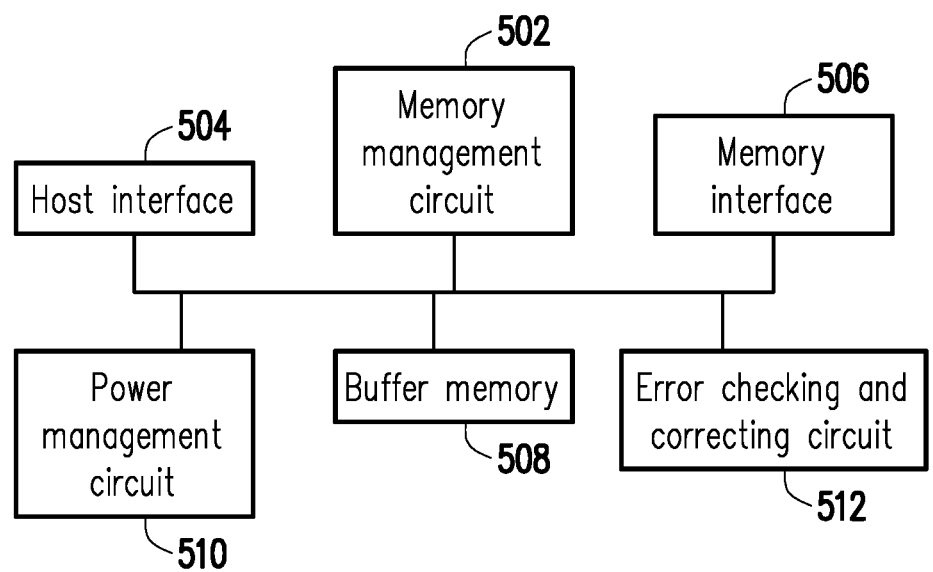
FIG. 5 is a schematic block diagram illustrating a memory control circuit unit according to an exemplary embodiment.

FIG. 5 is a schematic block diagram illustrating a memory control circuit unit according to an exemplary embodiment.

Referring to FIG. 5, the memory control circuit unit 404 includes a memory management circuit 502, a host interface 504 and a memory interface 506.

The memory management circuit 502 is configured to control overall operations of the memory control circuit unit 404. Specifically, the memory management circuit 502 has a plurality of control commands. When the memory storage apparatus 10 operates, the control commands are executed to perform various operations such as data writing, data reading and data erasing.

In the present exemplary embodiment, the control commands of the memory management circuit 502 are implemented in a firmware form. For instance, the memory management circuit 502 has a microprocessor unit (not illustrated) and a ROM (not illustrated), and the control commands are burned into the ROM. When the memory storage apparatus 10 operates, the control commands are executed by the microprocessor to perform operations of writing, reading or erasing data.

In another exemplary embodiment of the invention, the control commands of the memory management circuit 502 may also be stored, in form of program codes, into a specific area (e.g., a system area in the memory module exclusively for storing the system data) of the rewritable non-volatile memory module 406. In addition, the memory management circuit 502 has a microprocessor unit (not illustrated), a ROM (not illustrated) and a RAM (not illustrated). In particular, the ROM has a boot code, which is executed by the microprocessor unit to load the control commands stored in the rewritable non-volatile memory module 406 to the RAM of the memory management circuit 502 when the memory control circuit unit 404 is enabled. Later, the control commands are executed by the microprocessor unit to perform operations of writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 406; the memory writing circuit is configured to give a write command to the rewritable non-volatile memory module 406 in order to write data into the rewritable non-volatile memory module 406; the memory reading circuit is configured to give a read command to the rewritable non-volatile memory module 406 in order to read data from the rewritable non-volatile memory module 406; the memory erasing circuit is configured to give an erase command to the rewritable non-volatile memory module 406 in order to erase data from the rewritable non-volatile memory module 406; and The data processing circuit is configured to process both the data to be written into the rewritable non-volatile memory module 406 and the data read from the rewritable non-volatile memory module 406.

The host interface 504 is coupled to the memory management circuit 502 and configured to couple to the connection interface unit 402, so as to receive and identify commands and data sent from the host system 11. In other words, the commands and data transmitted by the host system 11 are transmitted to the memory management circuit 502 via the host interface 504. In the present exemplary embodiment, the host interface 504 is compatible with the SATA standard. Nevertheless, it should be understood that the present invention is not limited to the above. The host interface 504 may also be compatible with the PATA standard, the IEEE 1394 standard, the PCI Express standard, the USB standard, the UHS-I interface standard, the UHS-II interface standard, the SD standard, the MS standard, the MMC standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506.

In an exemplary embodiment, the memory control circuit unit 404 further includes a buffer memory 508, a power management circuit 510 and an error checking and correcting circuit 512.

The buffer memory 508 is coupled to the memory management circuit 502 and configured to temporarily store data and commands from the host system 11 or data from the rewritable non-volatile memory module 406.

The power management unit 510 is coupled to the memory management circuit 502 and configured to control a power of the memory storage apparatus 10.

The error checking and correcting circuit 512 is coupled to the memory management circuit 502 and configured to execute an error checking and correcting procedure to ensure the data integrity. Specifically, when the memory management circuit 502 receives a write command from the host system 11, the error checking and correcting circuit 512 generates an ECC code (Error Checking and Correcting Code) for the data corresponding to the write command, and the memory management circuit 502 writes the data and the ECC code corresponding to the write command into the rewritable non-volatile memory module 406. Later, when reading the data from the rewritable non-volatile memory module 406, the memory management circuit 502 also reads the error checking and correcting code corresponding to the data, and the error checking and correcting circuit 512 executes the error checking and correcting procedure for the read data according to the error checking and correcting code.

In the present exemplary embodiment, a low density parity code (LDPC) is implemented by the error checking and correcting circuit 512. However, in another exemplary embodiment, the error checking and correcting circuit 512 may also be implemented by encoding/decoding algorithms including a BCH code, a convolutional code, a turbo code, a bit flipping, etc.

Specifically, the memory management circuit 202 generates an error correction code frame (ECC frame) according to the received data and the corresponding error checking and correcting code (a.k.a. an error correction code) and writes the ECC frame into the rewritable non-volatile memory module 406. Then, when the memory management circuit 502 reads data from the rewritable non-volatile memory module 406, the error checking and correcting circuit 512 can verify the correctness of the read data according to the error correction code in the ECC frame.

In the following description, the operations executed by the memory management circuit 502, the host interface 504, the memory interface 506, the buffer memory 508, the power management circuit 510 and the error checking and correcting circuit 512 may also be referred to as being executed by the memory control circuit unit 404.

In the present exemplary embodiment, the rewritable non-volatile memory module 406 includes a plurality of physical erasing units and each of the physical erasing units includes a plurality of physical programming units. In particular, the memory management circuit 502 combines multiple physical erasing units belonging to different memory planes into one super physical unit before operations (e.g., a data writing operation, a data erasing operation, etc.) are performed, and each super physical programming unit of the super physical unit is composed of one of the physical programming units in each physical erasing unit.

It is noted that in the following description, some terms may be replaced with corresponding abbreviations for ease of reading (see Table 1).

TABLE 1

| | |
|---|---|
| rewritable non-volatile memory module | RNVM module |
| physical erasing unit | PEU |
| physical programming unit | PPU |
| physical unit array | PUA |
| super physical unit | SPU |
| super physical programming unit | SPPU |
| memory management circuit | MMC |
| memory control circuit unit | MCCU |
| temporary parity code | TPC |
| temporary parity code group | TPCG |
| updated parity code | UPC |
| updated parity code group | UPCG |
| parity code group | PCG |

Figure 6:
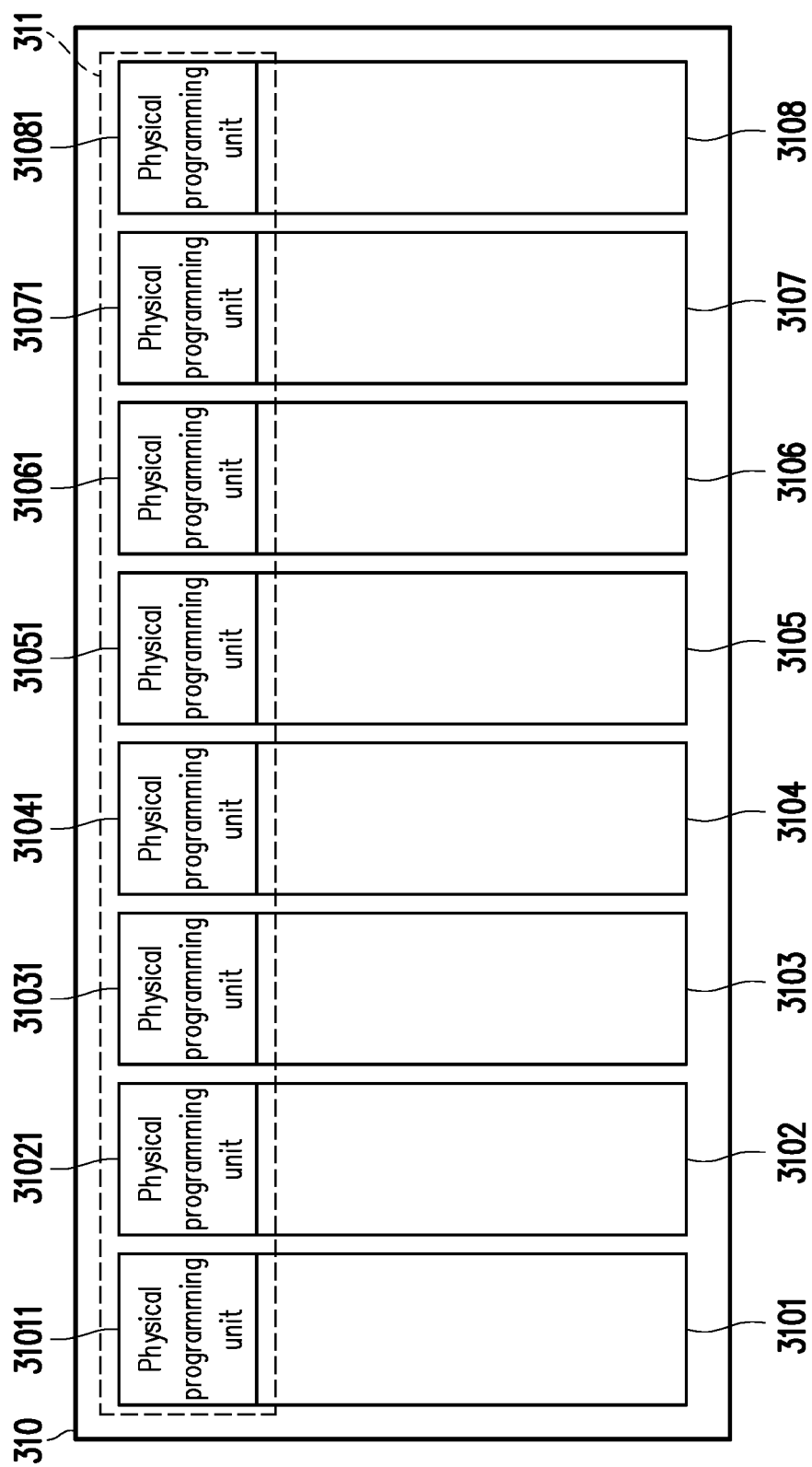
FIG. 6 is a schematic block diagram illustrating a super physical unit according to an exemplary embodiment of the invention.
Figure 7:
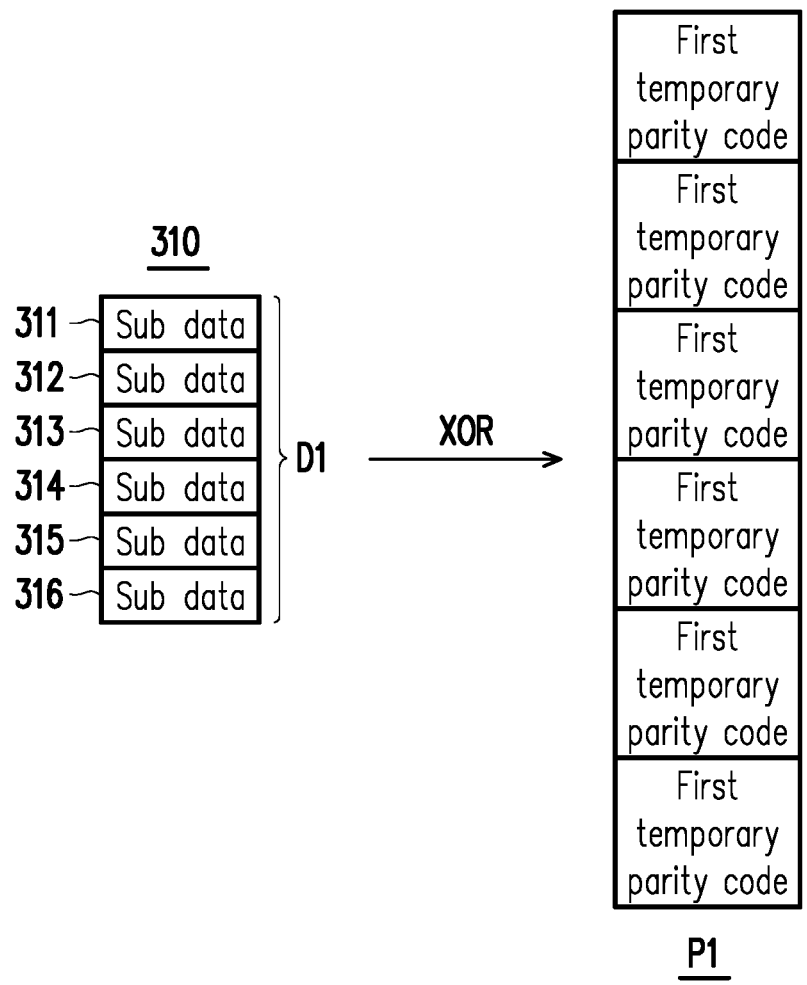
FIGS. 7 to 10 illustrate schematic diagrams for writing data into the super physical unit according to an exemplary embodiment of the invention.
Figure 8:
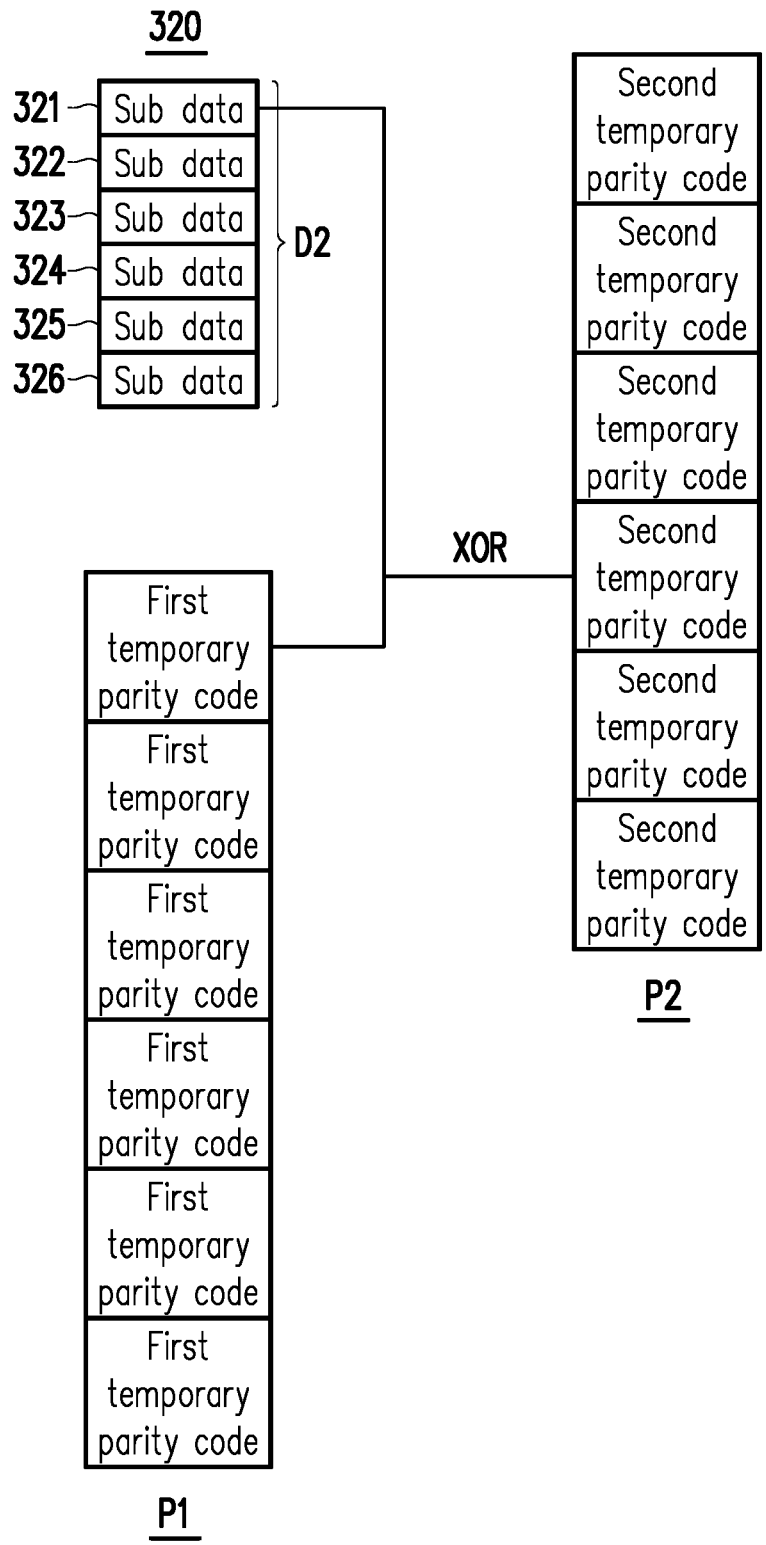

FIG. 6 is a schematic block diagram illustrating a super physical unit according to an exemplary embodiment.

With reference to FIG. 6, a SPU 310 is taken as an example for description. The MMC 502 groups a PEU 3101, a PEU 3102, a PEU 3103, a PEU 3104, a PEU 3105, a PEU 3106, a PEU 3107 and a PEU 3108 (which are simply referred to as the PEUs 3101 to 3108 hereinafter) into the SPU 310.

More specifically, as shown in FIG. 6, a PPU 31011 of the PEU 3101, a PPU 31021 of the PEU 3102, a PPU 31031 of the PEU 3103, a PPU 31041 of the PEU 3104, a PPU 31051 of the PEU 3105, a PPU 31061 of the PEU 3106, a PPU 31071 of the PEU 3107 and a PPU 31081 of the PEU 3108 commonly constitute a SPPU 311 of the SPU 310. In the present exemplary embodiment, because the PEUs included by the SPU 310 belong to the different memory planes, different PPUs in the SPPU 311 of the SPU 310 may be programmed at the same time.

In the present exemplary embodiment, for descriptive convenience, each of the SPU 310, the SPU 320, the SPU 330, the SPU 340 (simply referred to as the PPUs 310 to 340 hereinafter) includes six SPPUs, but the invention is not limited thereto.

Specifically, the SPU 310 includes SPPUs 311 to 316. The SPU 320 includes SPPUs 321 to 326. The SPU 330 includes SPPUs 331 to 336. The SPU 340 includes SPPUs 341 to 346.

FIGS. 7 to 10 illustrate schematic diagrams for writing data into the SPU according to an exemplary embodiment of the invention.

With reference to FIG. 7 to FIG. 10, it is assumed that the MCCU 404 receives a write command and first data D1 corresponding to the write command from the host system 11, and intends to write the first data D1 into the SPU 310 of the RNVM module 406. Here, the MMC 502 first divides the first data D1 into a plurality of sub data according a size of "the SPPU", and sequentially writes the sub data in accordance with the size of "the SPPU" into the SPPUs 311 to 316 in the SPU 310.

While writing the sub data in accordance with the size of "the SPPU" of the first data D1 into the SPPUs 311 to 316 of the SPU 310, the MMC 502 generates a plurality of first TPCs respectively corresponding to the sub data of the first data D1 based on the sub data of the first data D1. The first TPCs constitute a first TPCG P1.

When the MMC 502 intends to write second data D2 into the SPU 320 of the RNVM module 406, the MMC 502 first divides the second data D2 into a plurality of sub data according to the size of "the SPPU", and sequentially writes the sub data in accordance with the size of "the SPPU" into the SPPUs 321 to 326 in the SPU 320.

While the MMC 502 is writing the sub data in accordance with the size of "the SPPU" of the second data D2 into the SPPUs 321 to 326 in the SPU 320, the MMC 502 performs a logic operation on the sub data of the second data D2 sequentially written into the SPPUs 321 to 326 in the SPU 320 with the first TPCs of the first TPCG P1, respectively, so as to correspondingly generate a plurality of second TPCs. The second TPCs constitute a second TPCG P2. Here, the logic operation is, for example, an XOR operation.

Figure 9:
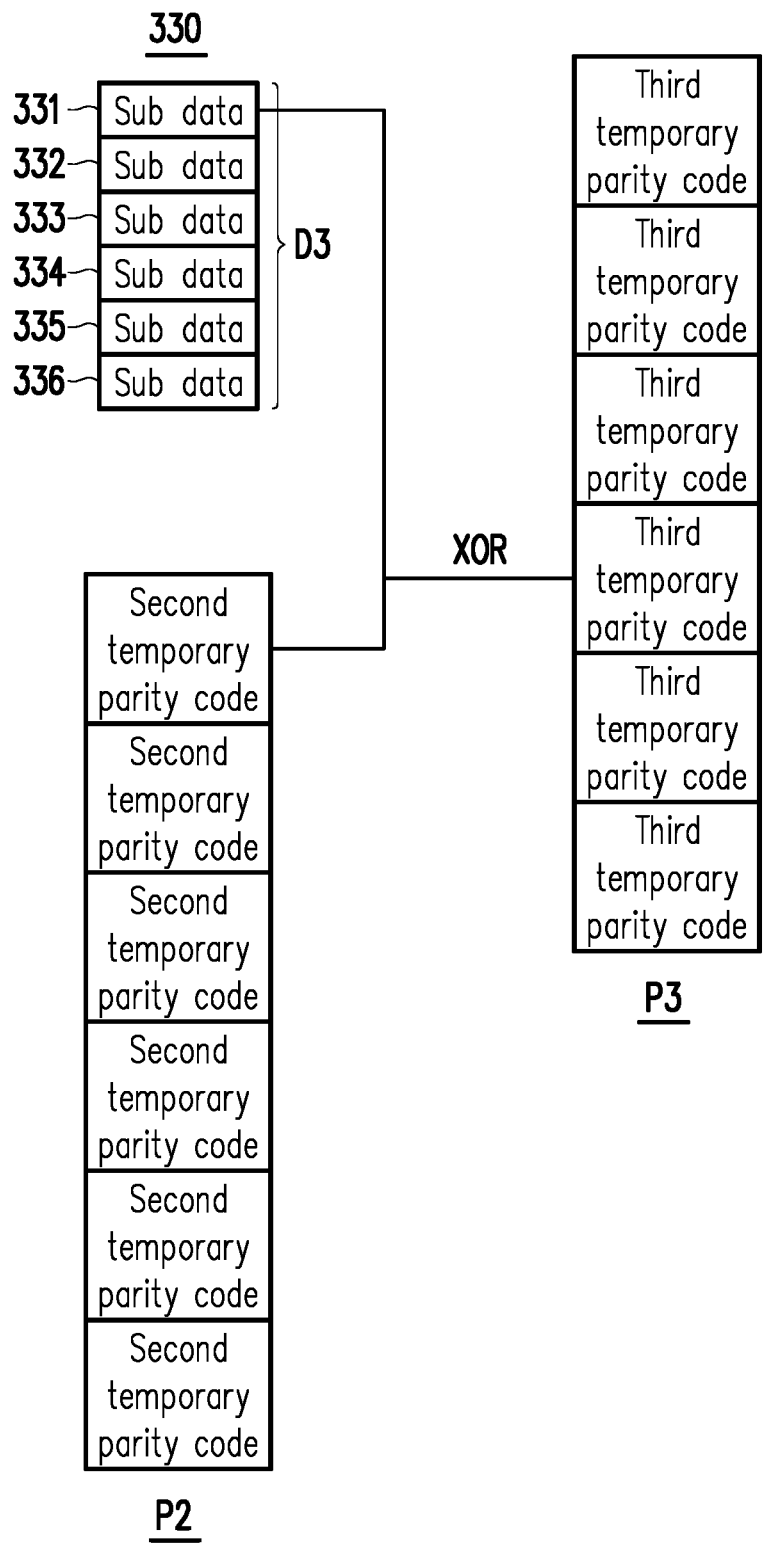
Figure 10:
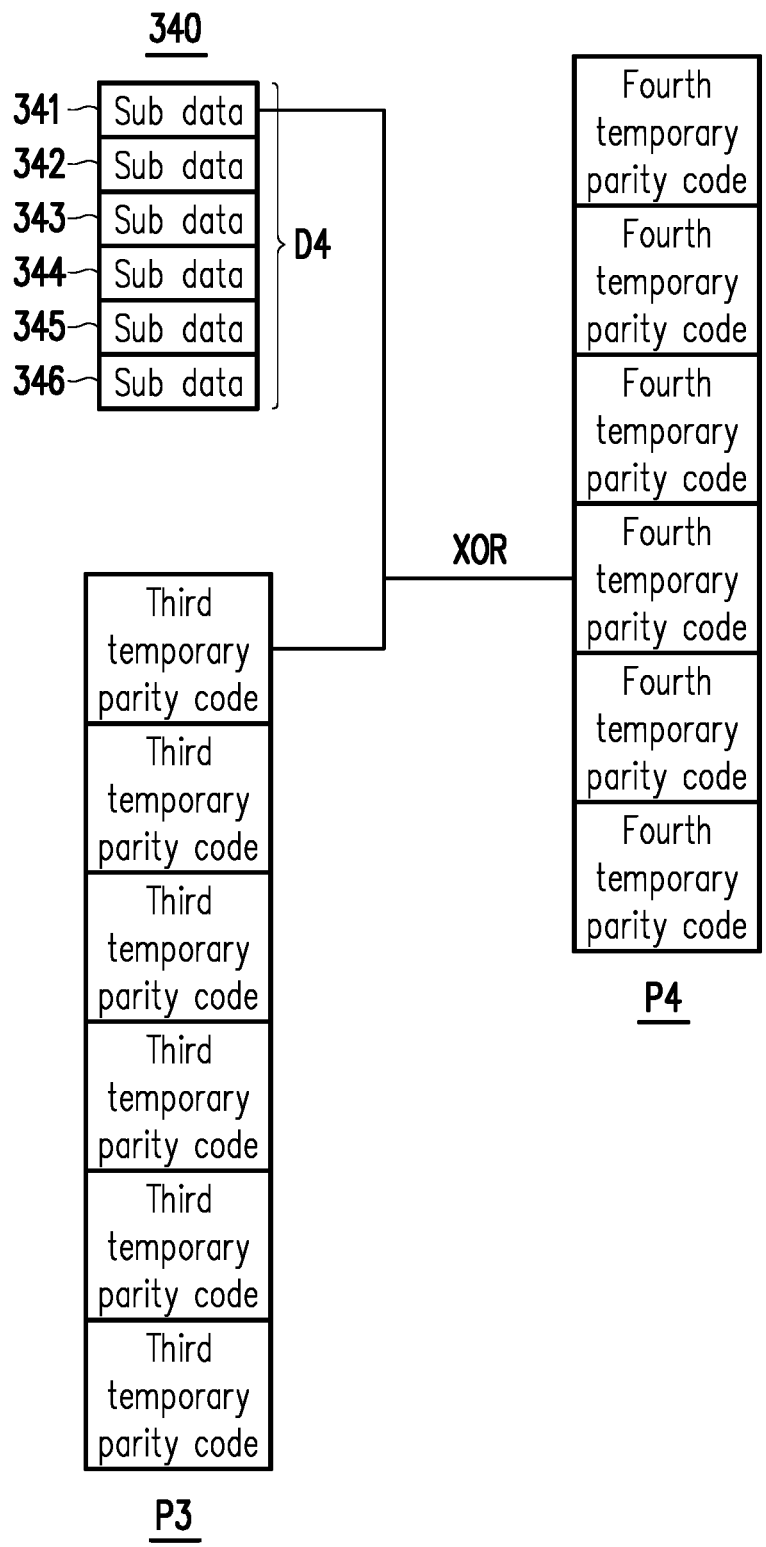

With reference to FIG. 9, when the MMC 502 intends to write third data D3 into the SPU 330 of the RNVM module 406, the MMC 502 first divides the third data D3 into a plurality of sub data according to the size of "the SPPU", and sequentially writes the sub data in accordance with the size of "the SPPU" into the SPPUs 331 to 336 in the SPU 330.

While the MMC 502 is writing the sub data in accordance with the size of "the SPPU" of the third data D3 into the SPPUs 331 to 336 in the SPU 330, the MMC 502 performs the logic operation on the sub data of the third data D3 sequentially written into the SPPUs 331 to 336 in the SPU 330 with the second TPCs of the second TPCG P2, respectively, so as to correspondingly generate a plurality of third TPCs. The third TPCs constitute a third TPCG P3.

Similarly, when the MMC 502 intends to write fourth data D4 into the SPU 340 of the RNVM module 406, the MMC 502 first divides the fourth data D4 into a plurality of sub data according to the size of "the SPPU", and sequentially writes the sub data in accordance with the size of "the SPPU" into the SPPUs 341 to 346 in the SPU 340.

While the MMC 502 is writing the sub data in accordance with the size of "the SPPU" of the fourth data D4 into the SPPUs 341 to 346 in the SPU 340, the MMC 502 performs the logic operation on the sub data of the fourth data D4 sequentially written into the SPPUs 341 to 346 in the SPU 340 with the third TPCs of the third TPCG P3, respectively, so as to correspondingly generate a plurality of fourth TPCs. The fourth TPCs constitute a fourth TPCG P4.

In particular, in the present exemplary embodiment, the MMC 502 associates multiple SPUs related to the calculated TPCGs as one PUA and store the PCGs corresponding thereto. If the data in any one SPU in the PUA are uncorrectable, error bits may be corrected by the stored PCGs.

Figure 11:
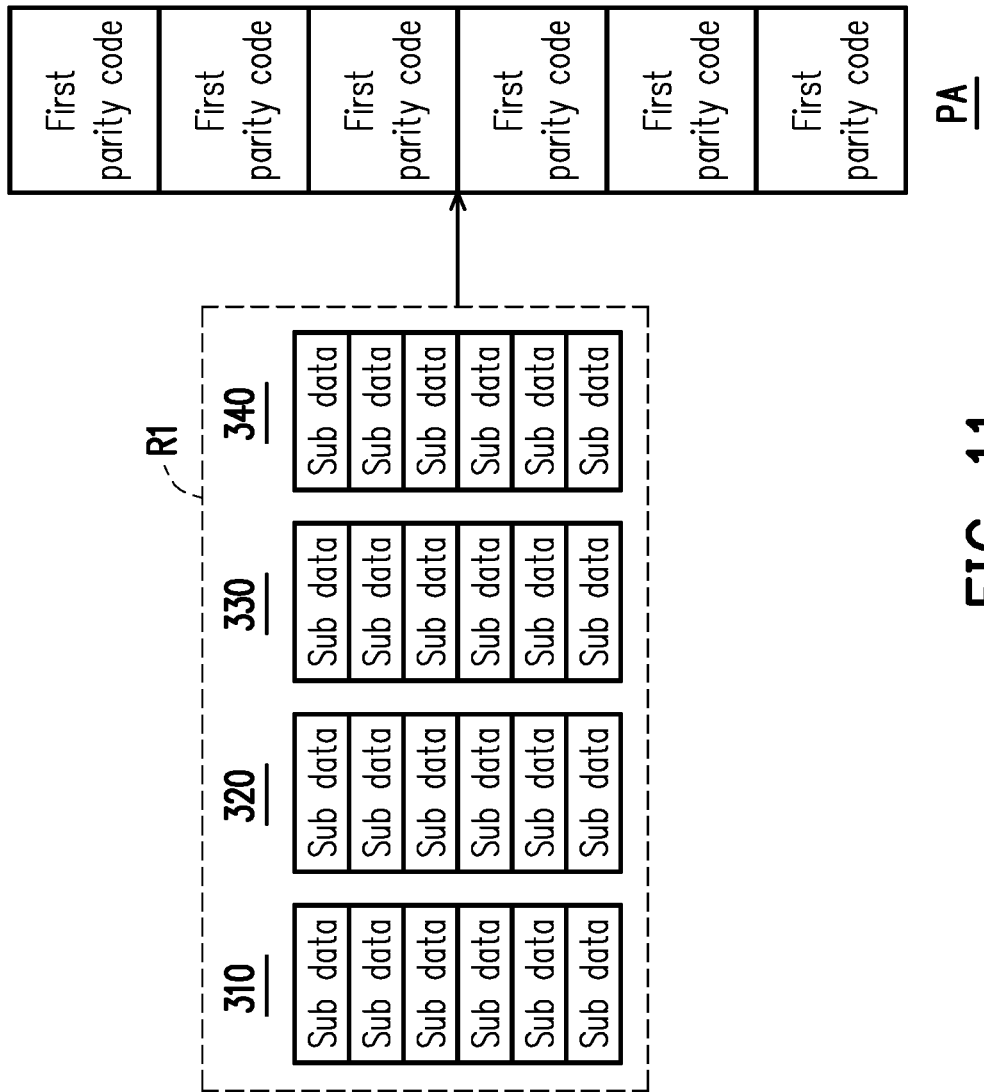
FIG. 11 is a schematic diagram illustrating a first physical unit array according to an exemplary embodiment of the invention.

FIG. 11 is a schematic diagram illustrating a PUA according to an exemplary embodiment.

In the present exemplary embodiment, the MMC 502 associates the SPUs 310 to 340 as a first PUA R1. The fourth TPCs of the fourth TPCG P4 are used as a plurality of first parity codes of the first PUA R1. The first parity codes constitute a first PCG PA of the first PUA R1.

In the present exemplary embodiment, when any one PEU in the SPUs 310 to 340 of the first PUA R1 has the error bits, the data originally stored in the physical unit having the error bits may be obtained according to data stored in the other PEUs and the first PCG PA of the first PUA R1 such that the error bits may be corrected accordingly. For example, if the data stored in the PEU 3101 of the SPU 310 has too many error bits, the data originally stored in the PEU 3101 of the SPU 310 may be obtained according to the data stored in the PEUs 3102 to 3108 of the SPU 310 and the first PCG PA. In other words, the first PCG PA of the first PUA R1 can protect the SPUs 310 to 340 associated with the first PUA R1. In this way, even if the data stored in any one PEU has too many error bits, the data stored in such PEU can still be recovered.

Figure 12:
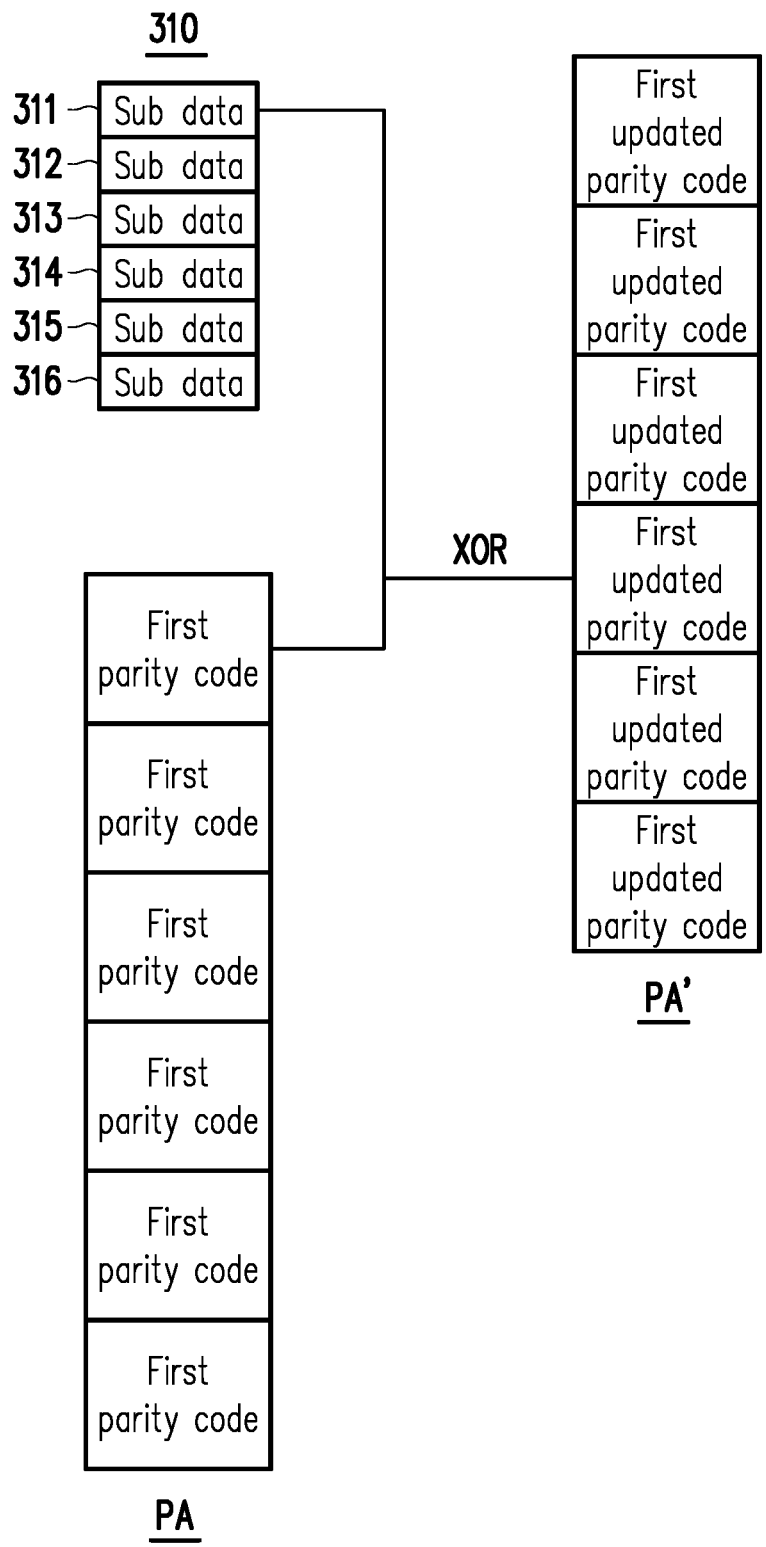
FIG. 12 and FIG. 13 illustrate schematic diagrams for generating an updated parity code group according to an exemplary embodiment of the invention.
Figure 13:
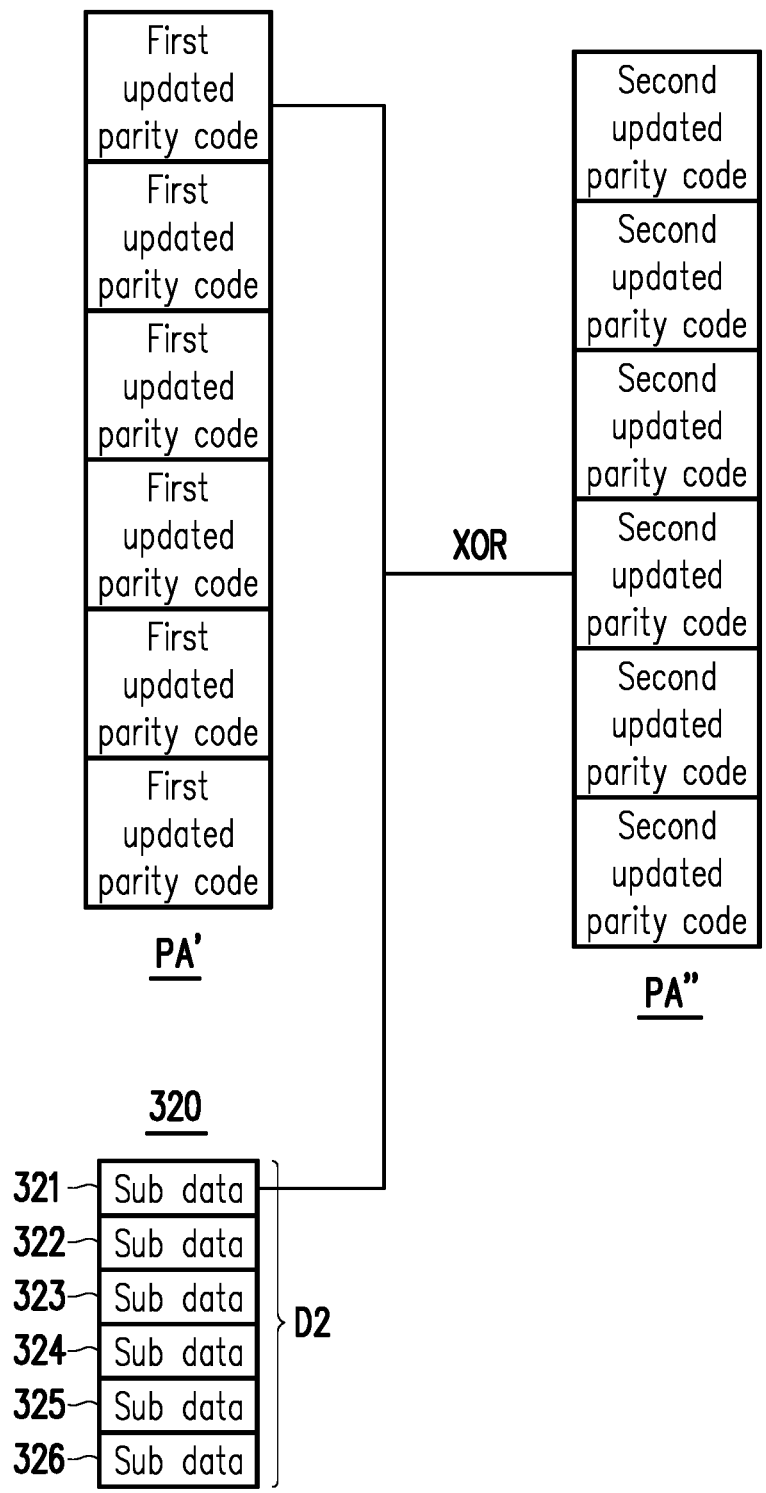

FIG. 12 and FIG. 13 illustrate schematic diagrams for generating an UPCG according to an exemplary embodiment.

With reference to FIG. 12 and FIG. 13, in the present exemplary embodiment, when the first data D1 written into the SPU 310 of the first PUA R1 all become invalid data, it is required to delete all the invalid data from the SPU 310. In this case, the MMC 502 performs the logic operation on the first parity codes of the first PCG PA of the first PUA R1 and the sub data of the first data D1 stored in the SPU 310 of the first PUA R1 so as to generate a plurality first UPCs. The first UPCs constitute a first UPCG PA'. Afterwards, the MMC 502 performs an erasing operation on the SPU 310 of the first PUA R1. In other words, the first data D1 stored in the SPPUs 311 to 316 of the SPU 310 of the first PUA R1 are deleted. At the time, since the SPU 310 becomes an empty SPU, the MMC 502 re-associates the other non-empty SPU 320 to 340 as the first PUA R1, and uses the first UPCG PA' as the first PCG PA of the re-associated first PUA R1.

Similarly, when the second data D2 of the SPU 320 of the first PUA R1 all become the invalid data, it is required to delete all the invalid data from the SPU 320. The MMC 502 performs the logic operation on the first parity codes of the first PCG PA (i.e., the first UPCs of the first UPCG PA') of the re-associated first PUA R1 and the sub data of the second data D2 stored in the SPU 320 of the first PUA R1 so as to generate a plurality of second UPCs. The second UPCs constitute a second UPCG PA". Afterwards, the MMC 502 performs the erasing operation on the SPU 320 of the first PUA R1. In other words, the second data D2 stored in the SPPUs 321 to 326 of the SPU 320 of the first PUA R1 are deleted. At the time, since the SPU 320 becomes the empty SPU, the MMC 502 re-associates the other non-empty SPU 330 as well as the SPU 340 as the first PUA R1, and uses the second UPCG PA" as the first PCG PA of the re-associated first PUA R1.

It is noted that, in an exemplary embodiment, when a number of the SPUs from certain PUAs is less than a predefined threshold, the MMC 502 then performs a PUA combining operation. Here, the redefined threshold may be regarded as a maximum number of the SPUs that can be associated as one PUA. For example, the predefined threshold may be set 4, which means that, the number of the SPUs associated with one PUA is not greater than 4.

Figure 14:
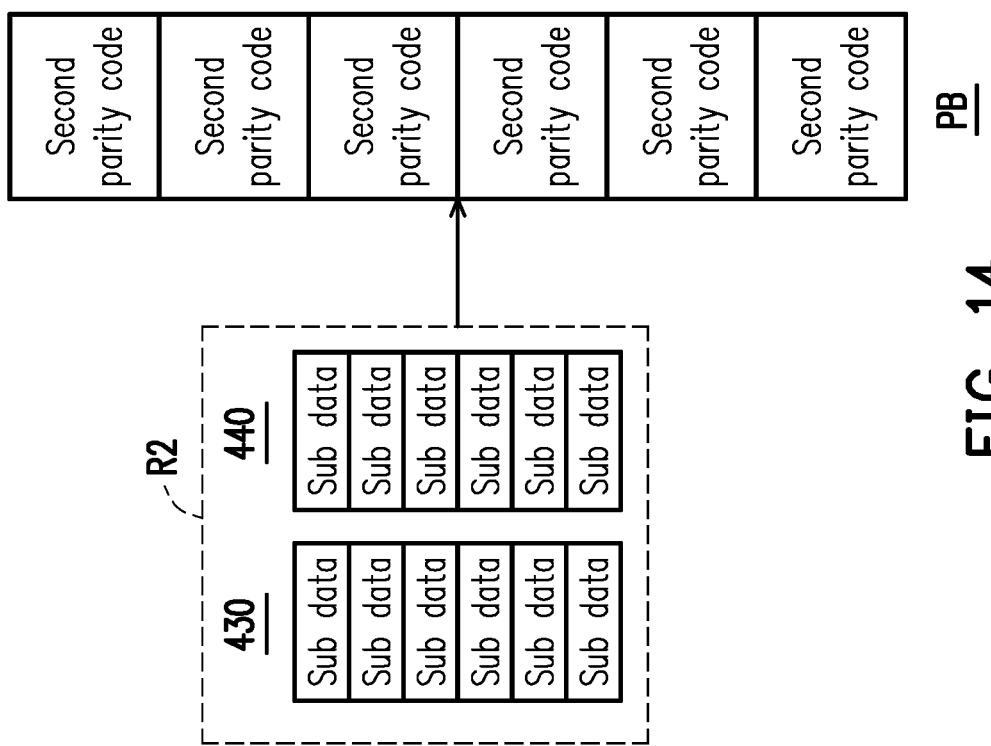
FIG. 14 to FIG. 16 illustrate schematic diagrams for performing a physical unit array combining operation according to an exemplary embodiment of the invention.
Figure 15:
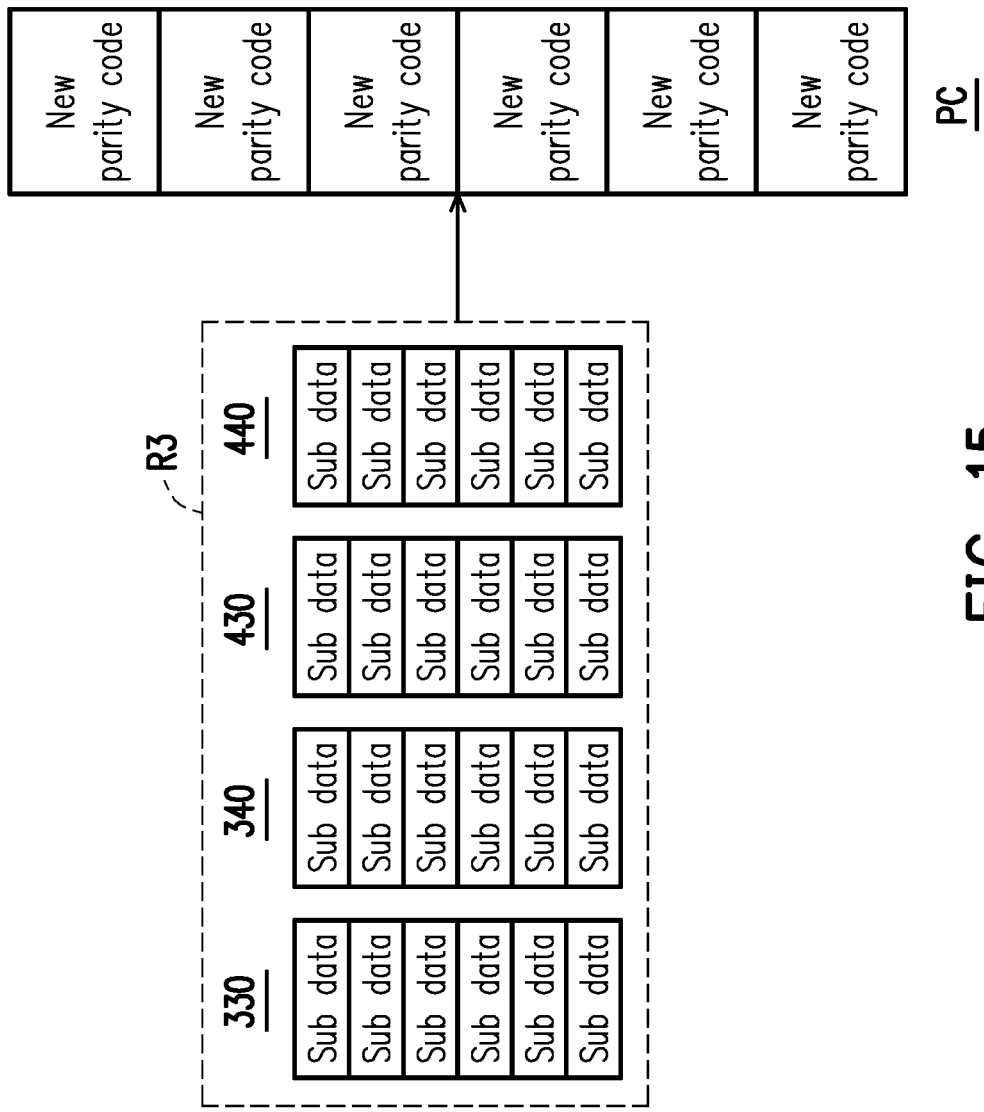
Figure 16:
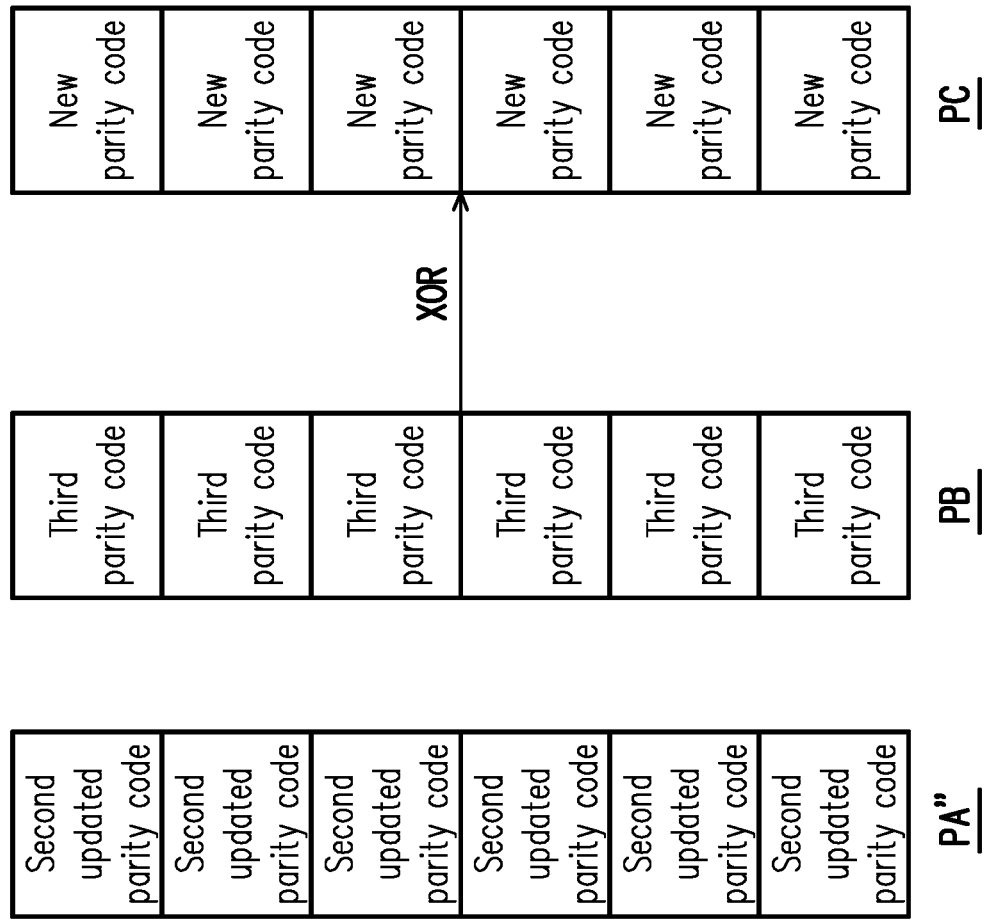

FIG. 14 to FIG. 16 illustrate schematic diagrams for performing a PUA combining operation according to an exemplary embodiment of the invention.

With reference to FIG. 14, a second PUA R2 includes a SPU 430 and a SPU 440.

In the present exemplary embodiment, after the logic operation is performed on a plurality of sub data of the SPU 430 and the SPU 440 associated with the second PUA R2, a plurality of second parity codes of a second PCG PB corresponding to the second PUA R2 are generated.

As described above, the invalid data of the SPU 310 and the SPU 320 have been deleted. Accordingly, only the SPU 330 and the SPU 340 are associated with the first PUA R1, and thus the first PCG PA of the first PUA R1 only protects the SPU 330 and the SPU 340. In order to prevent unnecessary parity codes from wasting the storage space, the MMC 502 combines the SPUs of the first PUA R1 with the SPUs of the second PUA R2 as a new PUA R3, performs the logic operation on the first PCG PA (i.e., the second UPCG PA") of the first PUA R1 and the second PCG PB of the second PUA R2 to obtain a plurality of new parity codes, and uses a PCG PC constituted by the new parity codes as a parity code PC corresponding to the new PUA R3. Afterwards, the MMC 502 deletes the first PCG PA and the second PCG PB.

With the method provided above, other than ensuring that the number of the SPUs associated with the PUA is not greater than the predefined threshold and ensuring that the PCG is able protect the maximum number of the SPUs, the unnecessary PCG may also be deleted to prevent wasting of the storage space.

It is noted that, the exemplary embodiments of invention are described with the example in which the RNVM module 406 includes two PUAs, each PUA includes four SPUs and each SPU include six SPPUs. Nevertheless, the present invention is not limited to the above. In other embodiments, the RNVM module 406 may also include more or less PUAs, each PUA may also include more or less SPUs, and each SPU may also include more or less SPPUs.

Figure 17:
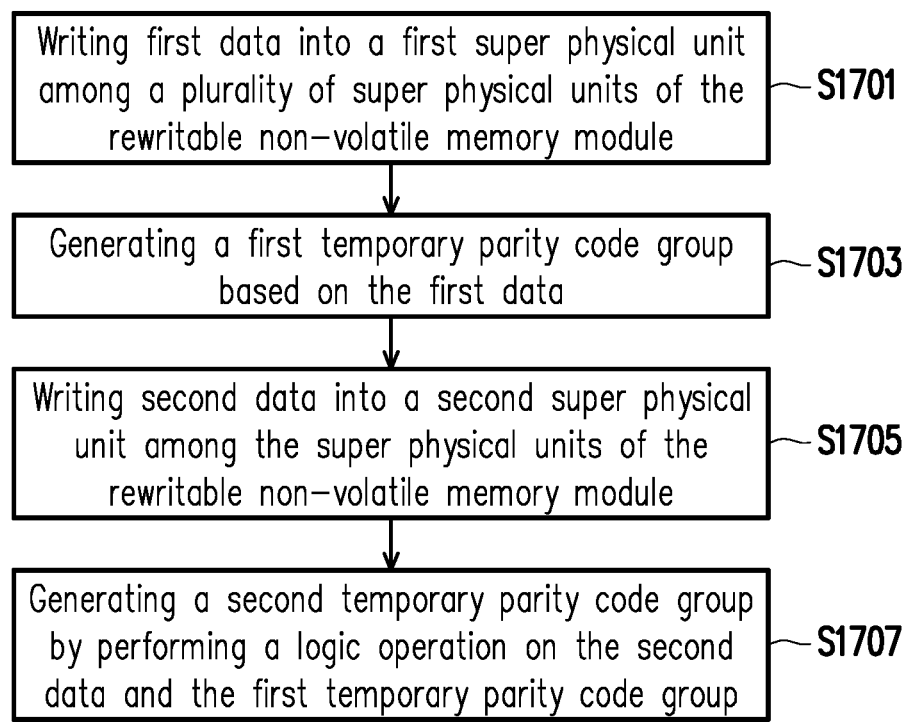
FIG. 17 is a flowchart illustrating a data protecting method according to an exemplary embodiment of the invention.

FIG. 17 is a flowchart illustrating a data protecting method according to an exemplary embodiment of the invention.

With reference to FIG. 17, in step S1701, the MMC 502 writes first data into a first SPU among a plurality of SPUs of the RNVM module 406.

In step S1703, the MMC 502 generates a first TPCG based on the first data. In step S1705, the MMC 502 writes second data into a second SPU among the SPUs of the RNVM module 406.

In step S1707, the MMC 502 generates a second TPCG by performing a logic operation on the second data and the first TPCG.

Figure 18:
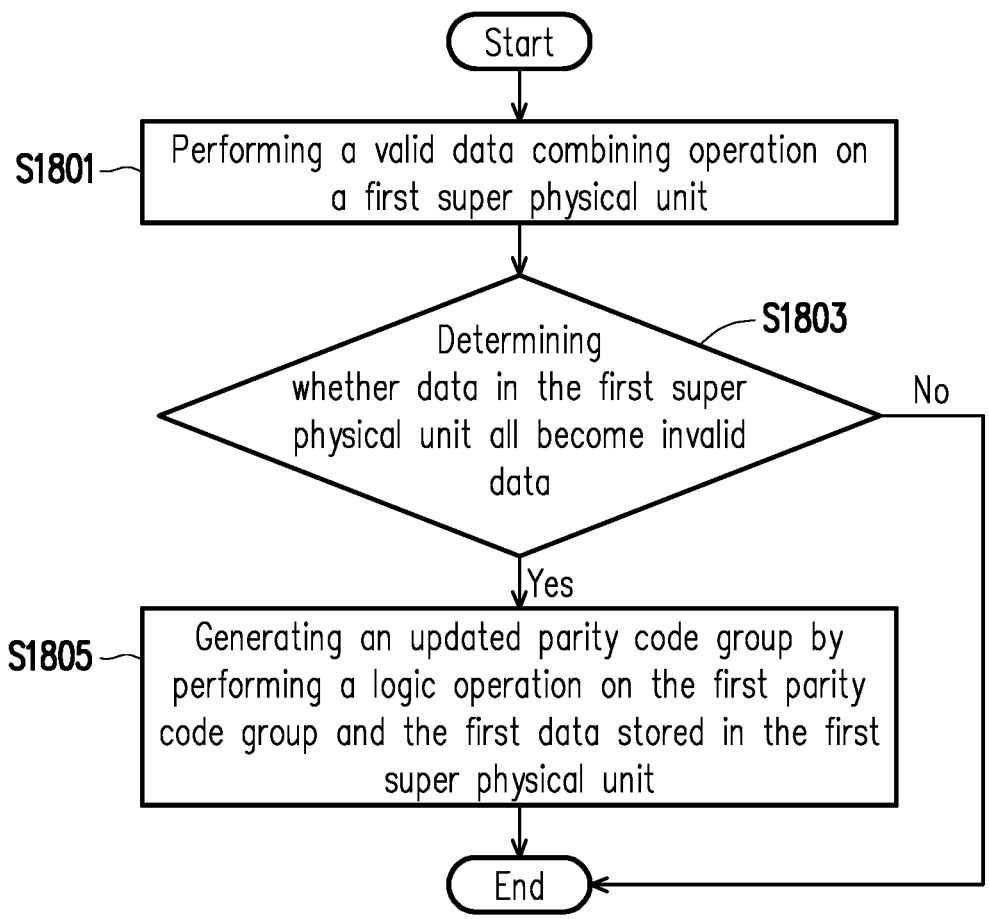
FIG. 18 is a flowchart illustrating a data protecting method according to another exemplary embodiment of the invention.

FIG. 18 is a flowchart illustrating a data protecting method according to another exemplary embodiment of the invention.

The MMC 502 performs a valid data combining operation on a first SPU in step S1801, and determines whether data in the first SPU all become invalid data in step S1803.

If the data in the first SPU all become the invalid data, in step S1805, the MMC 502 generates an UPCG by performing a logic operation on the first PCG and the first data stored in the first SPU.

Figure 19:
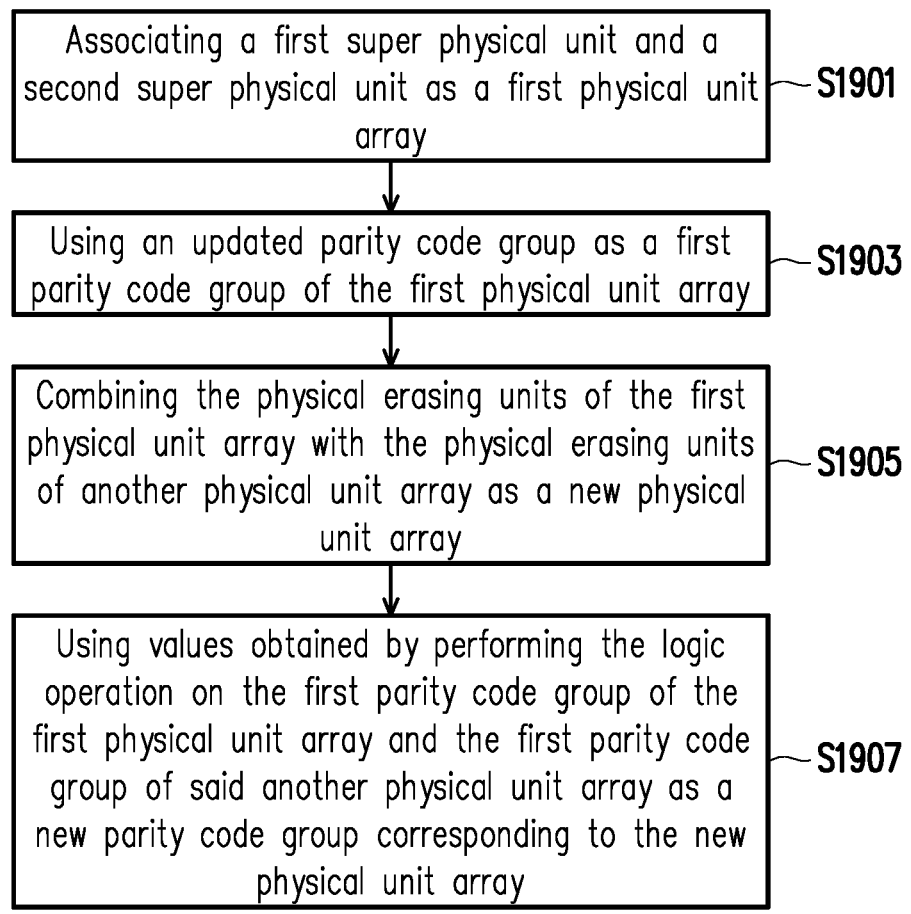
FIG. 19 is a flowchart illustrating a data protecting method according to another exemplary embodiment of the invention.

FIG. 19 is a flowchart illustrating a data protecting method according to another exemplary embodiment of the invention.

With reference to FIG. 19, in step S1901, the MMC 502 associates a first SPU and a second SPU as a first PUA. In step S1903, the MMC 502 uses an UPCG as a first PCG of the first PUA. In step S1905, the MMC 502 combines the SPUs of the first PUA with the SPUs of another PUA as a new PUA. In step S1907, the MMC 502 uses values obtained by performing the logic operation on the first PCG of the first PUA and the PCG of said another PUA as a new PCG corresponding to the new PUA.

In summary, when there are too many error bits in any one PEU, the data protecting method, the MCCU and the memory storage apparatus of the invention are capable of recovering the data stored in the PEU having the error bits by utilizing the data and the generated PCGs from the other PEUs. As a result, not only can the data stored in the RNVM module be effectively protected, a certain number of SPUs may also be protected by using the PCGs while saving the storage space required by the PCGs.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A data protecting method for a rewritable non-volatile memory module, the rewritable non-volatile memory module comprising a plurality of super physical units, the data protecting method comprising:

writing first data into a first super physical unit among the super physical units;

generating a first temporary parity code group based on the first data;

writing second data into a second super physical unit among the super physical units;

generating a second temporary parity code group by performing a logic operation on the second data and the first temporary parity code group;

associating the first super physical unit and the second super physical unit as a first physical unit array;

using the second temporary parity code group as a first parity code group of the first physical unit array; and generating an updated parity code group by performing the logic operation on the first parity code group and the first data stored in the first super physical unit when data in the first super physical unit all become invalid data.

2. The data protecting method according to claim 1, further comprising:
using the updated parity code group as the first parity code group of the first physical unit array.

3. The data protecting method according to claim 2, further comprising:
writing third data into a third super physical unit among the super physical units before the data in the first super physical unit of the first physical unit array all become the invalid data; and
generating a third temporary parity code group by performing the logic operation on the third data and the second temporary parity code group.

4. The data protecting method according to claim 1, wherein the first super physical unit comprises a plurality of physical erasing units, each of the physical erasing units of the first super physical unit comprises a plurality of physical programming units, and each of the physical erasing units of the first super physical unit belongs to a different memory plane.

5. The data protecting method according to claim 2, further comprising:
combining the super physical units of the first physical unit array with the super physical units of another physical unit array as a new physical unit array; and
using values obtained by performing the logic operation on the first parity code group of the first physical unit array and another parity code group of said another physical unit array as a new parity code group corresponding to the new physical unit array.

6. The data protecting method according to claim 5, wherein a number of the super physical units associated with the first physical unit array is not greater than a predefined threshold, a number of the super physical units associated with said another physical unit array is not greater than the predefined threshold, and a number of the super physical units associated with the new physical unit array is not greater than the predefined threshold.

7. The data protecting method according to claim 1, wherein the logic operation is an XOR operation.

8. A memory control circuit unit, configured to control a rewritable non-volatile memory module, the memory control circuit unit comprising:
a host interface, configured to electrically connect to a host system;
a memory interface, configured to electrically connect to the rewritable non-volatile memory module, wherein the rewritable non-volatile memory module comprises a plurality of super physical units; and
a memory management circuit, electrically connected to the host interface and the memory interface,
wherein the memory management circuit is configured to write first data into a first super physical unit among the super physical units;
wherein the memory management circuit is configured to generate a first temporary parity code group based on the first data;
wherein the memory management circuit is configured to write second data into a second super physical unit among the super physical units;
wherein the memory management circuit is configured to generate a second temporary parity code group by performing a logic operation on the second data and the first temporary parity code group;
wherein the memory management circuit is configured to associate the first super physical unit and the second super physical unit as a first physical unit array;
wherein the memory management circuit is configured to use the second temporary parity code group as a first parity code group of the first physical unit array; and
wherein the memory management circuit is configured to generate an updated parity code group by performing the logic operation on the first parity code group and the first data stored in the first super physical unit when data in the first super physical unit all become invalid data.

9. The memory control circuit unit according to claim 8, wherein
the memory management circuit is configured to use the updated parity code group as the first parity code group of the first physical unit array.

10. The memory control circuit unit according to claim 9, wherein the memory management circuit is configured to write third data into a third super physical unit among the super physical units before the data in the first super physical unit of the first physical unit array all become the invalid data; and
wherein the memory management circuit is further configured to generate a third temporary parity code group by performing the logic operation on the third data and the second temporary parity code group.

11. The memory control circuit unit according to claim 8, wherein the first super physical unit comprises a plurality of physical erasing units, each of the physical erasing units of the first super physical unit comprises a plurality of physical programming units, and each of the physical erasing units of the first super physical unit belongs to a different memory plane.

12. The memory control circuit unit according to claim 9, wherein the memory management circuit is configured to combine the super physical units of the first physical unit array with the super physical units of another physical unit array as a new physical unit array;
wherein the memory management circuit is configured to use values obtained by performing the logic operation on the first parity code group of the first physical unit array and another parity code group of said another physical unit array as a new parity code group corresponding to the new physical unit array.

13. The memory control circuit unit according to claim 12,
wherein a number of the super physical units associated with the first physical unit array is not greater than a predefined threshold, a number of the super physical units associated with said another physical unit array is not greater than the predefined threshold, and a number of the super physical units associated with the new physical unit array is not greater than the predefined threshold.

14. A memory storage apparatus, comprising:
a connector, configured to electrically connect to a host system;
a rewritable non-volatile memory module, comprising a plurality of super physical units; and
a memory control circuit unit, electrically connected to the connector and the rewritable non-volatile memory module,
wherein the memory control circuit unit is configured to write first data into a first super physical unit among the super physical units;

wherein the memory control circuit unit is configured to generate a first temporary parity code group based on the first data;

wherein the memory control circuit unit is configured to write second data into a second super physical unit among the super physical units;

wherein the memory control circuit unit is configured to generate a second temporary parity code group by performing a logic operation on the second data and the first temporary parity code group;

wherein the memory control circuit unit is configured to associate the first super physical unit and the second super physical unit as a first physical unit array;

wherein the memory control circuit unit is configured to use the second temporary parity code group as a first parity code group of the first physical unit array; and wherein the memory control circuit unit is configured to generate an updated parity code group by performing the logic operation on the second temporary parity code group and the first data stored in the first super physical unit when data in the first super physical unit all become invalid data.

15. The memory storage apparatus according to claim 14, wherein the memory control circuit unit is configured to use the updated parity code group as the first parity code group of the first physical unit array.

16. The memory storage apparatus according to claim 15, wherein wherein the memory control circuit unit is configured to write third data into a third super physical unit among the super physical units before the data in the first super physical unit of the first physical unit array all become the invalid data; and wherein the memory control circuit unit is configured to generate a third temporary parity code group by performing the logic operation on the third data and the second temporary parity code group.

17. The memory storage apparatus according to claim 14, wherein the first super physical unit comprises a plurality of physical erasing units, each of the physical erasing units of the first super physical unit comprises a plurality of physical programming units, and each of the physical erasing units of the first super physical unit belongs to a different memory plane.

18. The memory storage apparatus according to claim 15, wherein the memory control circuit unit is configured to combine the super physical units of the first physical unit array with the super physical units of another physical unit array as a new physical unit array;

wherein the memory control circuit unit is configured to use values obtained by performing the logic operation on the first parity code group of the first physical unit array and another parity code group of said another physical unit array as a new parity code group corresponding to the new physical unit array.

19. The memory storage apparatus according to claim 18, wherein a number of the super physical units associated with the first physical unit array is not greater than a predefined threshold, a number of the super physical units associated with said another physical unit array is not greater than the predefined threshold, and a number of the super physical units associated with the new physical unit array is not greater than the predefined threshold.

20. The memory storage apparatus according to claim 14, wherein the logic operation is an XOR operation.

* * * * *